(12) United States Patent
Rapp et al.

(10) Patent No.: US 8,189,345 B2
(45) Date of Patent: May 29, 2012

(54) ELECTRONICS MODULE, ENCLOSURE ASSEMBLY HOUSING SAME, AND RELATED SYSTEMS AND METHODS

(75) Inventors: John W. Rapp, Manassas, VA (US); Nicholas J. Nagurny, Manassas, VA (US); Brent I. Gouldey, Aldie, VA (US); Mark Jones, Centreville, VA (US); Wendy S. Normark, Lorton, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 1006 days.

(21) Appl. No.: 12/141,773

(22) Filed: Jun. 18, 2008

(65) Prior Publication Data

US 2010/0046175 A1    Feb. 25, 2010

(51) Int. Cl.
*H05K 7/14* (2006.01)
(52) U.S. Cl. ......... 361/797; 361/796; 361/759; 361/747
(58) Field of Classification Search .................. 361/796, 361/797, 788, 752, 747, 732, 759, 801
See application file for complete search history.

(56) References Cited

U.S. PATENT DOCUMENTS

| | | | |
|---|---|---|---|
| 2,976,806 A * | 3/1961 | Risk et al. ...................... 361/732 |
| 3,272,933 A * | 9/1966 | Henderson ...................... 200/46 |
| 3,434,014 A | 3/1969 | Taynton |
| 3,596,139 A | 7/1971 | Walsh |
| 3,833,840 A * | 9/1974 | Sinden ........................... 361/827 |
| 3,970,198 A | 7/1976 | Prater |
| 4,542,442 A * | 9/1985 | Drexler ........................... 361/787 |
| 4,679,872 A * | 7/1987 | Coe .................................. 439/61 |
| 4,823,951 A | 4/1989 | Colomina |
| 5,060,111 A | 10/1991 | Takashima |
| 5,063,475 A * | 11/1991 | Balan ......................... 361/679.49 |
| 5,105,337 A * | 4/1992 | Bitller et al. ................... 361/722 |
| 5,119,273 A | 6/1992 | Corda |
| 5,251,097 A | 10/1993 | Simmons et al. |
| 5,289,694 A * | 3/1994 | Nordin ........................... 62/259.2 |
| 5,301,089 A * | 4/1994 | Takashima ...................... 361/744 |
| 5,319,526 A | 6/1994 | Takashima |
| 5,420,428 A * | 5/1995 | Bullington et al. ......... 250/338.2 |
| 5,552,976 A | 9/1996 | Munro et al. |
| 5,604,666 A | 2/1997 | Yoshizawa |
| 5,621,617 A * | 4/1997 | Goss et al. ..................... 361/721 |
| 5,650,917 A * | 7/1997 | Hsu ............................... 361/759 |
| 5,757,998 A | 5/1998 | Thatcher et al. |
| 5,903,432 A * | 5/1999 | McMahon ...................... 361/690 |
| 5,984,688 A | 11/1999 | Norris |
| 6,104,611 A | 8/2000 | Glover et al. |
| 6,225,559 B1 | 5/2001 | Hubner et al. |
| 6,351,374 B1 | 2/2002 | Sherry |

(Continued)

*Primary Examiner* — Dameon Levi
(74) *Attorney, Agent, or Firm* — Mark A. Wurm; Bryan A. Santarelli; Graybeal Jackson LLP (57) ABSTRACT

Various embodiments of the invention relate to electronics modules, enclosure assemblies housing at least one such electronics module, and systems (e.g., missiles or unmanned vehicles) that may employ such enclosure assemblies. In one embodiment, an electronics module includes a first plate extending generally in a first plane, and a second plate spaced from the first plate and extending generally in a second plane. The electronics module further includes a plurality of electronic board assemblies each of which extends generally in a respective plane and is in thermal communication with at least one of the first and second plates. Each electronic board assembly may be positioned between the first and second plates and oriented so that the respective plane thereof is non-parallel relative to the first and second planes.

37 Claims, 9 Drawing Sheets

U.S. PATENT DOCUMENTS

| | | | |
|---|---|---|---|
| 6,351,383 B1 * | 2/2002 | Payton | 361/704 |
| 6,402,031 B1 | 6/2002 | Hall | |
| 6,665,182 B2 | 12/2003 | Hogerl | |
| 6,735,086 B1 * | 5/2004 | Weber et al. | 361/719 |
| 6,744,637 B2 * | 6/2004 | Blazic et al. | 361/796 |
| 6,766,950 B2 | 7/2004 | Hall | |
| 6,768,642 B2 | 7/2004 | Hines et al. | |
| 6,865,085 B1 * | 3/2005 | Ferris et al. | 361/721 |
| 6,892,646 B1 * | 5/2005 | Zimmerman et al. | 102/293 |
| 6,894,907 B2 | 5/2005 | Gustine et al. | |
| 6,917,523 B2 | 7/2005 | Summers et al. | |
| 6,976,113 B2 | 12/2005 | Krishnamurthy et al. | |
| 6,983,385 B2 | 1/2006 | German et al. | |
| 7,215,557 B2 * | 5/2007 | Glovatsky et al. | 361/804 |
| 7,230,833 B1 | 6/2007 | Sickels | |
| 7,330,354 B2 | 2/2008 | Watanabe | |
| 7,997,770 B1 | 8/2011 | Meurer | |
| 2002/0030973 A1 | 3/2002 | Scafidi | |
| 2002/0166040 A1 | 11/2002 | Crane, Jr. et al. | |
| 2003/0193571 A1 | 10/2003 | Schultz et al. | |
| 2003/0235042 A1 | 12/2003 | Harris et al. | |
| 2004/0003154 A1 | 1/2004 | Harris et al. | |
| 2004/0130927 A1 | 7/2004 | Schulz et al. | |
| 2004/0133763 A1 | 7/2004 | Mathur et al. | |
| 2004/0136241 A1 | 7/2004 | Rapp et al. | |
| 2004/0170070 A1 | 9/2004 | Rapp et al. | |
| 2004/0181621 A1 | 9/2004 | Mathur et al. | |
| 2004/0225802 A1 | 11/2004 | Krishnamurthy et al. | |
| 2006/0085781 A1 | 4/2006 | Rapp et al. | |
| 2006/0087450 A1 | 4/2006 | Schulz et al. | |
| 2006/0101250 A1 | 5/2006 | Rapp et al. | |
| 2006/0101253 A1 | 5/2006 | Rapp et al. | |
| 2006/0101307 A1 | 5/2006 | Rapp et al. | |
| 2006/0123021 A1 | 6/2006 | Byers | |
| 2006/0123282 A1 | 6/2006 | Gouldey et al. | |
| 2006/0149920 A1 | 7/2006 | Rapp et al. | |
| 2006/0230377 A1 | 10/2006 | Rapp et al. | |
| 2006/0265927 A1 | 11/2006 | Rapp et al. | |
| 2010/0046177 A1 | 2/2010 | Rapp et al. | |
| 2010/0282057 A1 | 11/2010 | Rapp et al. | |

* cited by examiner

ELECTRONICS MODULE, ENCLOSURE ASSEMBLY HOUSING SAME, AND RELATED SYSTEMS AND METHODS

RELATED APPLICATIONS

This application is related to U.S. Patent Application entitled "Enclosure Assembly Housing At Least One Electronic Board Assembly and Systems Using Same" naming John W. Rapp, Nicholas J. Nagurny, Brent I. Gouldey, Mark Jones, and Wendy S. Normark as inventors, filed concurrently herewith, and incorporated herein by this reference in its entirety.

BACKGROUND

Many weapon systems, such as air-to-air missiles and torpedos, and vehicles, such as unmanned undersea vehicles ("UUVs"), include an enclosure for housing control electronics and other components. Fitting commercially available electronics, such as PCI mezzanine cards, into such weapon systems and vehicles may be difficult because the enclosures may have unusual dimensions that are specific to a particular application. For example, a torpedo or a small missile may have a cylindrical fuselage that has a diameter in the approximate range of, for example, 4 to 21 inches, for housing control electronics, a motor, propellant, a warhead, or other component.

One approach for fitting electronics into an odd-shaped enclosure has been to design custom electronics specifically configured to fit into the enclosure. For example, a disk-shaped circuit board may be designed to fit in a transverse cross-sectional interior of a tube of a specific diameter. However, such custom electronics are generally not useable in enclosures of a different configuration, and are not scaleable for smaller or larger enclosures. For example, a 4 inch diameter disk-shaped circuit board designed for a 4-inch diameter tube may not be useable in a 21-inch tube. As another example, all of the circuitry on a single 21-inch disk-shaped circuit board may not be capable of being scaled down to fit onto a single 4-inch disk-shaped circuit board, so one may need to re-design and/or re-layout the circuitry to fit on more than one circuit board in the 4-inch tube.

SUMMARY

Various embodiments of the invention relate to electronics modules, enclosure assemblies housing at least one such electronics module, and systems (e.g., missiles or unmanned vehicles) that may employ such enclosure assemblies. In an embodiment, an electronics module includes a first plate extending generally in a first plane, and a second plate spaced from the first plate and extending generally in a second plane. The electronics module further includes a plurality of electronic board assemblies each of which extends generally in a respective plane and is in thermal communication with at least one of the first and second plates. Each electronic board assembly may be positioned between the first and second plates and oriented so that the respective plane thereof is non-parallel relative to the first and second planes.

In another embodiment, an enclosure assembly includes an enclosure having an interior surface defining an interior space and at least one electronics module positioned within the interior space. The electronics module includes a first plate extending generally in a first plane and having a first outer peripheral surface configured to be in thermal contact with the interior surface of the enclosure. The electronics module further includes a second plate extending generally in a second plane and having a second outer peripheral surface configured to be in thermal contact with the interior surface of the enclosure. The electronics module also includes a plurality of electronic board assemblies, each of which extends generally in a respective plane and is in thermal communication with at least one of the first and second plates. Each electronic board assembly may be positioned between the first and second plates and oriented so that the respective plane thereof is non-parallel relative to the first and second planes.

In yet another embodiment, a system (e.g., a missile, UUV, or other unmanned vehicle) may include any of the disclosed enclosure assembly embodiments provided herein.

BRIEF DESCRIPTION OF THE DRAWINGS

The drawings illustrate various embodiments, wherein like reference numerals refer to like elements or features in different views or embodiments shown in the drawings.

DETAILED DESCRIPTION

Various embodiments of the invention relate to electronics modules, enclosure assemblies housing at least one such electronics module, and systems (e.g., missiles, UUVs, and other unmanned vehicles) that may employ such enclosure assemblies. The electronics modules may employ multiple electronic board assemblies of similar size and/or configuration to control the operation of such vehicles. The electronic board assemblies may be sandwiched between two plates for efficient heat transfer so that heat generated during operation of the electronic board assemblies is transferred to the plates, from the plates to the enclosure, and to the surrounding environment from the enclosure.

Figure 1:
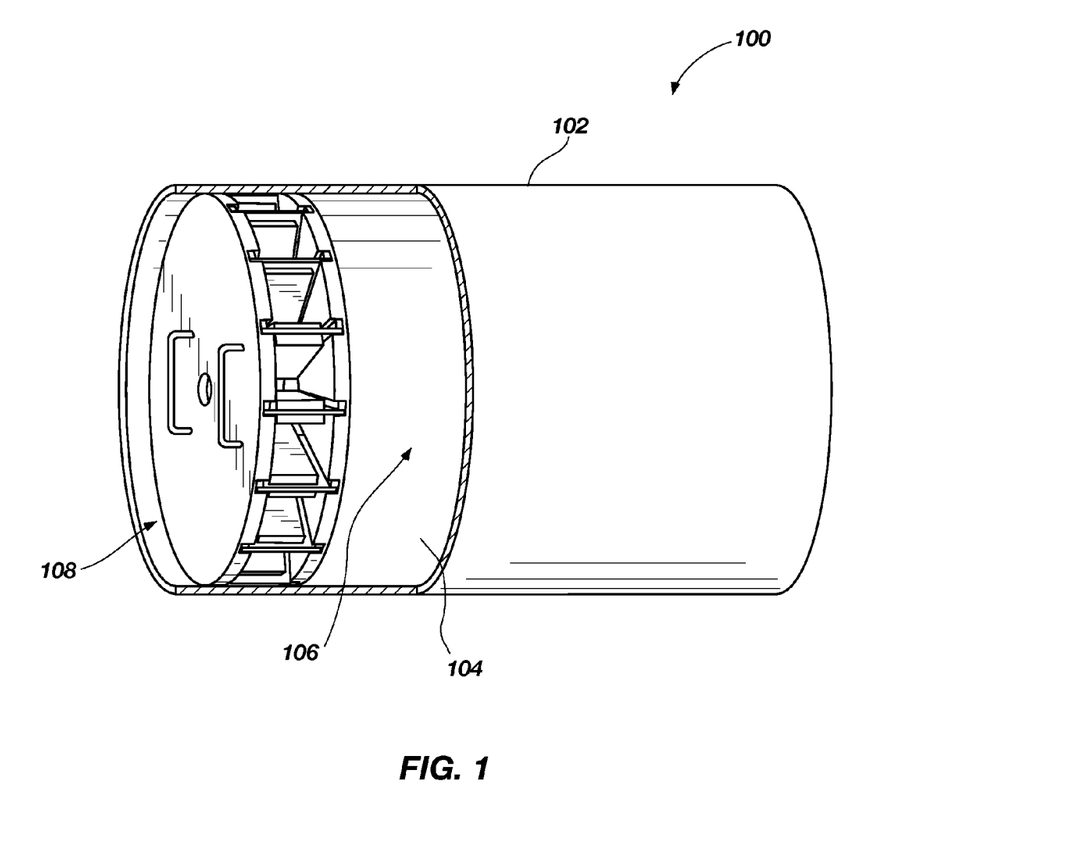
FIG. 1 is an isometric partial cut-away view of an enclosure assembly according to an embodiment of the invention.

FIG. 1 is an isometric partial cut-away view of an enclosure assembly 100 according to an embodiment of the invention. The enclosure assembly 100 includes a generally tubular enclosure 102 having an interior surface 104 defining an interior space 106. For example, the tubular enclosure 102 may be made from a structural material, such as steel, an aluminum alloy, a composite material, or another suitable structural material. The enclosure assembly 100 further includes at least one electronics module 108 that is positioned and secured within the interior space 106 of the tubular enclosure 102. For example, the electronics module 108 may be bolted to the interior surface 104, the electronics module may include provisions for interlocking with the enclosure 102 or an associated locking structure, or the electronics module may be secured within the tubular enclosure 102 according to another suitable technique.

Figure 2A:
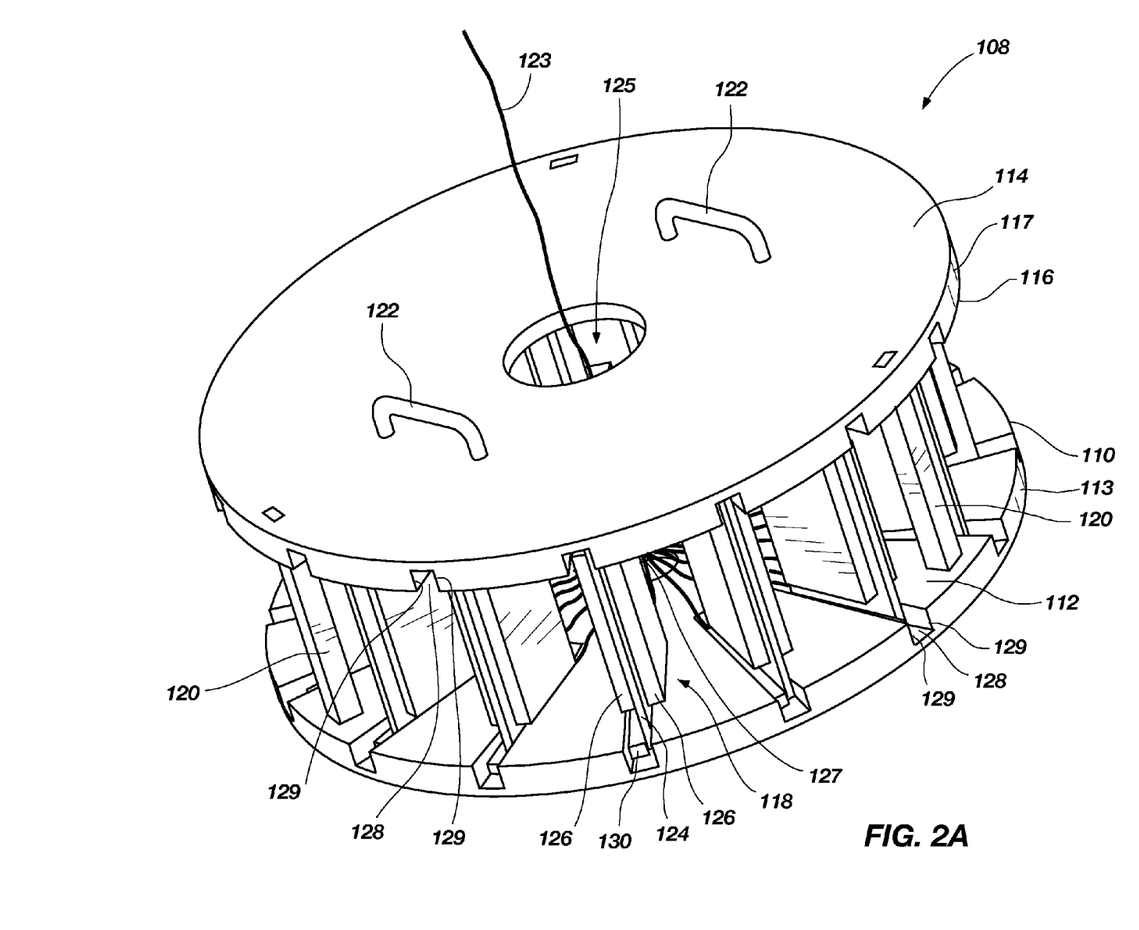
FIG. 2A is an isometric view of the electronics module shown in FIG. 1.

FIG. 2A is an isometric view of the electronics module 108 of FIG. 1. The electronics module 108 includes a first circular plate 110 having a first interior surface 112 and an outer peripheral surface 113. The electronics module 108 further includes a second circular plate 114 spaced from the first circular plate 110 and having a second interior surface 116 and an outer peripheral surface 117. The outer peripheral surfaces 113 and 117 are each generally configured to correspond to the geometry of and to be in thermal contact with the interior surface 106 of the tubular enclosure 102. In other embodiments, however, the first and second circular plates 110 and 114 may be non-circular and snugly fit within a hollow enclosure having an interior space with a non-circular transverse cross-sectional geometry. The first and second circular plates 110 and 114 may each have a diameter of, for example, greater than about 4 inches, about 12 inches, or about 21 inches to snugly fit in a tubular enclosure having an inner diameter that closely matches the diameter of the first and second circular plates 110 and 114. When the electronics module 108 is received within the interior space 106, the outer peripheral surfaces 113 and 117 may abut or otherwise interface with the interior surface 104 of the tubular enclosure 102.

A plurality of electronic board assemblies 118 are positioned between and mounted to the first and second interior surfaces 112 and 116 so that each electronic board assembly 118 is in thermal communication with at least one of the first and second circular plates 110 and 114. Each electronic board assembly 118 may be oriented lengthwise along a radial direction of the first and second circular plates 110 and 114. A plurality of support members 120 may interconnect the first circular plate 110 to the second circular plate 114 to stiffen the assembly. To aid in installation of the electronics module 108, one or more handles 122 may be attached to the first circular plate 110 (or the second circular plate 114) and be configured to be grasped by an installer.

The first and second circular plates 110 and 114 may each be made from a high-thermal conductivity structural material, such as a copper alloy, an aluminum alloy, a graphite-based material, or another suitable high-thermal conductivity structural material. In an embodiment, in order to further enhance heat transfer from the enclosure assembly 102, a first thermal conduction interface gasket (not shown) extends about and is bonded to the outer peripheral surface 113 of the first circular plate 110, and a second thermal conduction interface gasket (not shown) extends about and is bonded to the outer peripheral surface 117 of the second circular plate 114. The thermal conduction interface gaskets abut with the interior surface 104 of the tubular enclosure 102 for efficient heat transfer from the plurality of electronic board assemblies 118 to the first and second circular plates 110 and 114, from the first and second circular plates 110 and 114 to the tubular enclosure 102, and finally from the tubular enclosure 102 to the environment (e.g., air or water) surrounding the tubular enclosure 102. For example, the thermal conduction interface gasket may be a flexible graphite sheet known as Grafoil®, which is commercially available from American Seal and Packaging of Fountain Valley, Calif.

Still referring to FIG. 2A, each electronic board assembly 118 may include a carrier board 124 operatively coupled to two electronic circuit boards 126 mounted on opposing sides of the carrier board 124. Each electronic circuit board 126 extends generally in a plane that is substantially parallel to the plane in which the carrier board 124 extends. Additionally, each electronic board assembly 118 extends generally in a plane that is non-parallel (e.g., generally perpendicular) to respective planes in which first and second circular plates 110 and 114 extend. Furthermore, the carrier board 124 of each electronic board assembly 118 may be electrically connected to a common cable bus 123 that passes through an opening 125 formed in, for example, the second circular plate 114 via respective cables 127 connected to each carrier board 124. External electrical connections or contacts on each carrier board 124 (e.g., for connecting to the respective cable 127) may be provided on any suitable location and do not need to be located on a peripheral edge. There may be many different ways that the electronic board assemblies 118 may be configured, and some embodiments are discussed in more detail below with respect to FIGS. 3 and 4.

Figure 2B:
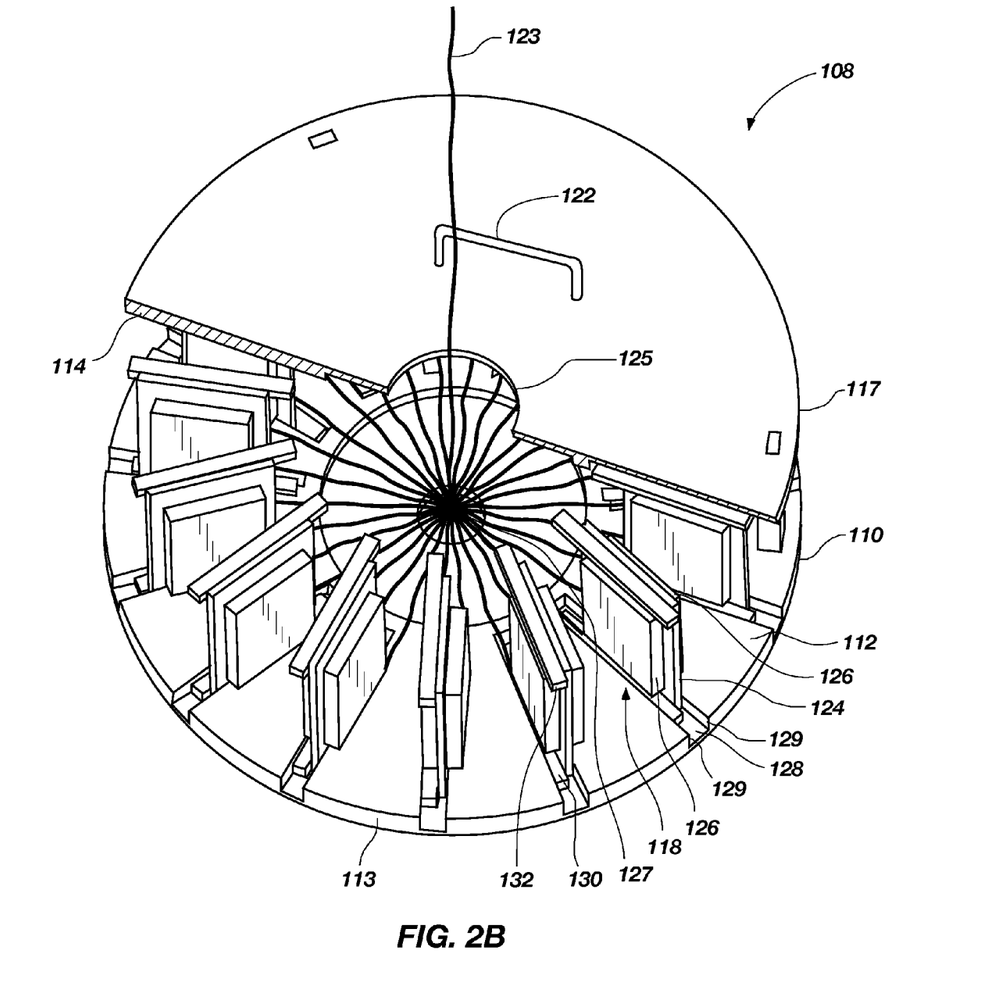
FIG. 2B is an isometric partial cut-away view of the electronics module shown in FIG. 2A.

FIG. 2B is an isometric partial cut-away view of the electronics module 108 shown in FIG. 2A, and illustrates the configuration of the first and second circular plates 110 and 114 in more detail and the manner in which each electronic board assembly 118 may be mounted to the first and second circular plates 110 and 114. The first circular plate 110 includes a plurality of circumferentially spaced and radially extending slots 128 having sidewalls 129 and the second circular plate 114 also includes a plurality of circumferentially spaced and radially extending slots 128 having sidewalls 129.

Still referring to FIG. 2B, each electronic board assembly 118 includes first and second mounting devices 130 and 132 attached to the carrier board 124 using one or more fasteners, such as rivets, screws, or other suitable fasteners. The first mounting device 130 of each electronic board assembly 118 may be positioned within a corresponding one of the slots 128 of the first circular plate 110, and is configured to engage at least one of the sidewalls 129 thereof. The second mounting device 132 may be positioned within a corresponding one of the slots 128 (See FIG. 2A) of the second circular plate 114, and is configured to engage at least one of the sidewalls 129 thereof. In an embodiment, each of the first and second mounting devices 130 and 132 may be configured as a locking device. One suitable locking device is a wedge-lock type device configured to controllably expand within a corresponding one of the slots 128 to bear against one of the sidewalls 129 and compress the carrier board 124, to which it is mounted, against the other one of the sidewalls 129. For example, suitable locking devices are disclosed in U.S. Pat. Nos. 3,970,198 and 4,823,951, which are incorporated by reference, and such locking devices are commercially available from Birtcher Products of Poway, Calif.

In an embodiment, the first and second mounting devices 130 and 132 may be made from a high-thermal conductivity material, such as an aluminum alloy, a copper alloy, or another suitable material. In such an embodiment, heat generated by the respective electronic board assemblies 118 during operation is conducted via thermal conduction to the first and second mounting devices 130 and 132, from the first and second mounting devices 130 and 132 to the corresponding first and second circular plates 110 and 114, and from the first and second circular plates 110 and 114 to the tubular enclosure 102. Thus, the tubular enclosure 102 may function as a "cold wall" so that heat generated by the operation of the electronic board assemblies 118 is conducted radially outward to the tubular enclosure and, then, into the environment (e.g., air or water) surrounding the tubular enclosure to promote cooling of the electronic board assemblies 118.

In another embodiment, the slots 128 may extend along a non-radial direction. For example, the outer peripheral surface 113 of the first circular plate 110 defines chords along which respective slots may extend and the outer peripheral surface 117 of the second circular plate 114 defines chords along which respective slots may extend. Other slot arrangements may also be used.

The electronic board assemblies 118 may be designed to fit in an enclosure, such as a tubular enclosure having an inner diameter of about 4 inches. Thus, the electronic board assemblies 118 may have a length or width of about 4 inches to allow for use in such smallest tubular enclosures. For example, the carrier board 124 of each electronic board assembly 118 may have a length or width of about 4 inches. However, computing power may be increased by assembling a number of the electronic board assemblies 118 and interconnecting them, as desired or needed for a particular application, to form the electronics module 108 for use in a tubular enclosure having an inner diameter greater than 4 inches.

In practice, one or more of the electronics modules 108 may be inserted into the interior space 106 of the tubular enclosure 102. As desired or needed for a particular application, the electronics module 108 may be conveniently removed, and one or more of the electronic board assemblies 118 or one or more of the electronic circuit boards 126 thereof may be removed for repair or replacement, for example, with a more powerful electronic board assembly or an electronic board assembly configured to perform different computing functions. Then, the electronics module 108 may be re-installed having the replacement electronic board assembly 118 or electronic circuit board.

In some applications, one or more of the electronic circuit boards 126 may be removed and replaced with more computationally powerful electronic circuit boards. In such a case, one or both of the electronic circuit boards 126 of a respective electronic board assembly 118 may be removed and not replaced because the more powerful electronic circuit boards of other electronic board assemblies 118 provide sufficient computing power for the particular application. The carrier boards 124, without having corresponding electronic circuit boards 126 thereon, may be left in the electronics module 108 for convenience and also to increase the speed at which the electronics module 108 may be replaced in the enclosure 102.

Figure 3:
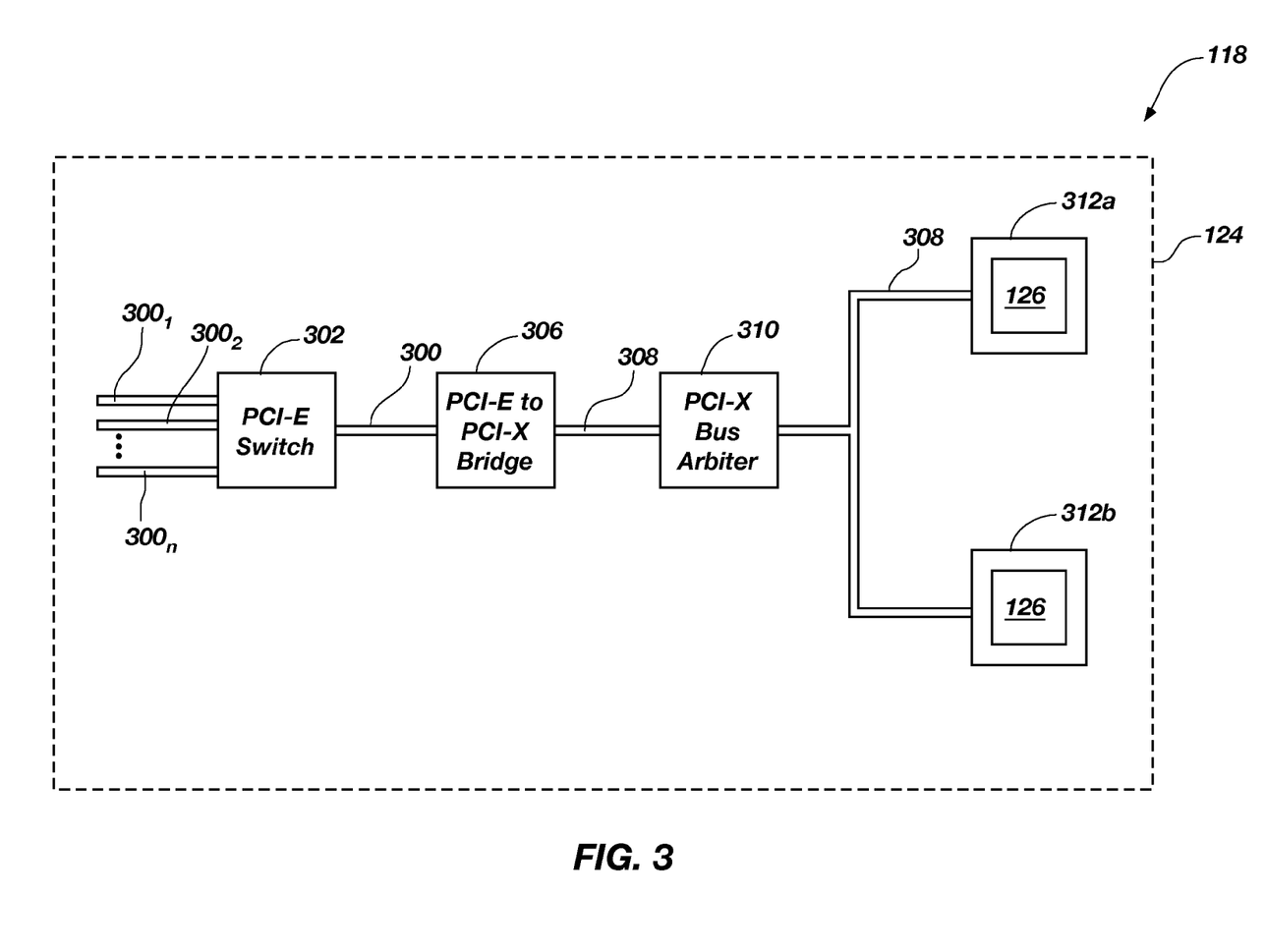
FIG. 3 is a schematic block diagram of one of the electronic board assemblies shown in FIGS. 2A and 2B according to an embodiment of the invention.

FIG. 3 is a schematic block diagram of an embodiment for an electronic board assembly 118 shown in FIGS. 2A and 2B. The carrier board 124 of the electronic board assembly 118 may include one or more busses, such as peripheral component interface ("PCI") express buses $300_1$-$300_n$, which are serial buses that each have a number of lanes (e.g., four lanes). For example, the PCI express busses $300_1$-$300_n$ may employ a serializer/deserializer commonly known as SERDES. The carrier board 124 may also include a PCI-express ("PCI-E") switch 302 coupled to the buses $300_1$-$300_n$ that functions similar to a multiplexer and is configured to selectively allow communication from one of the buses $300_1$-$300_n$ to a PCI-E-to-PCI-X bridge 306. The PCI-E-to-PCI-X bridge 306 is configured to convert the PCI-E buses $300_1$-$300_n$ to a PCI-X bus 308.

Still referring to FIG. 3, the carrier board 124 further includes a PCI-X bus arbiter 310 coupled to the PCI-E-to-PCI-X bridge 306 via the PCI-X bus 308. The carrier board 124 further includes two board slots 312a and 312b, each of which is positioned on an opposing side of the carrier board 124 and coupled to the PCI-X bus arbiter 310 via the PCI-X bus 308. One of the electronic circuit boards 126 is inserted into the board slot 312a and operatively coupled to the PCI-X bus arbiter 310, and the other one of the electronic circuit boards 126 is inserted into the board slot 312b and operatively coupled to the PCI-X bus arbiter 310. One, two, four, eight, sixteen, or thirty-two lanes of data may be transmitted from the carrier board 124 to each electronic circuit board 126. For example, the PCI-X bus arbiter 310 is configured to selectively connect one of the electronic circuit boards 126 to the PCI-X bus 308 at any give time to enable communication with another device remote from the carrier board 124, such as another electronic circuit board 126 on another electronic board assembly 118.

In some embodiments, one or more of the electronic circuit boards 126 may be a PCI mezzanine board (also known as a PMC card). However, it is noted that the use of PCI mezzanine boards is merely one example, and many different off-the-shelf cards having formats other than the PCI mezzanine boards may be used.

Figure 4:
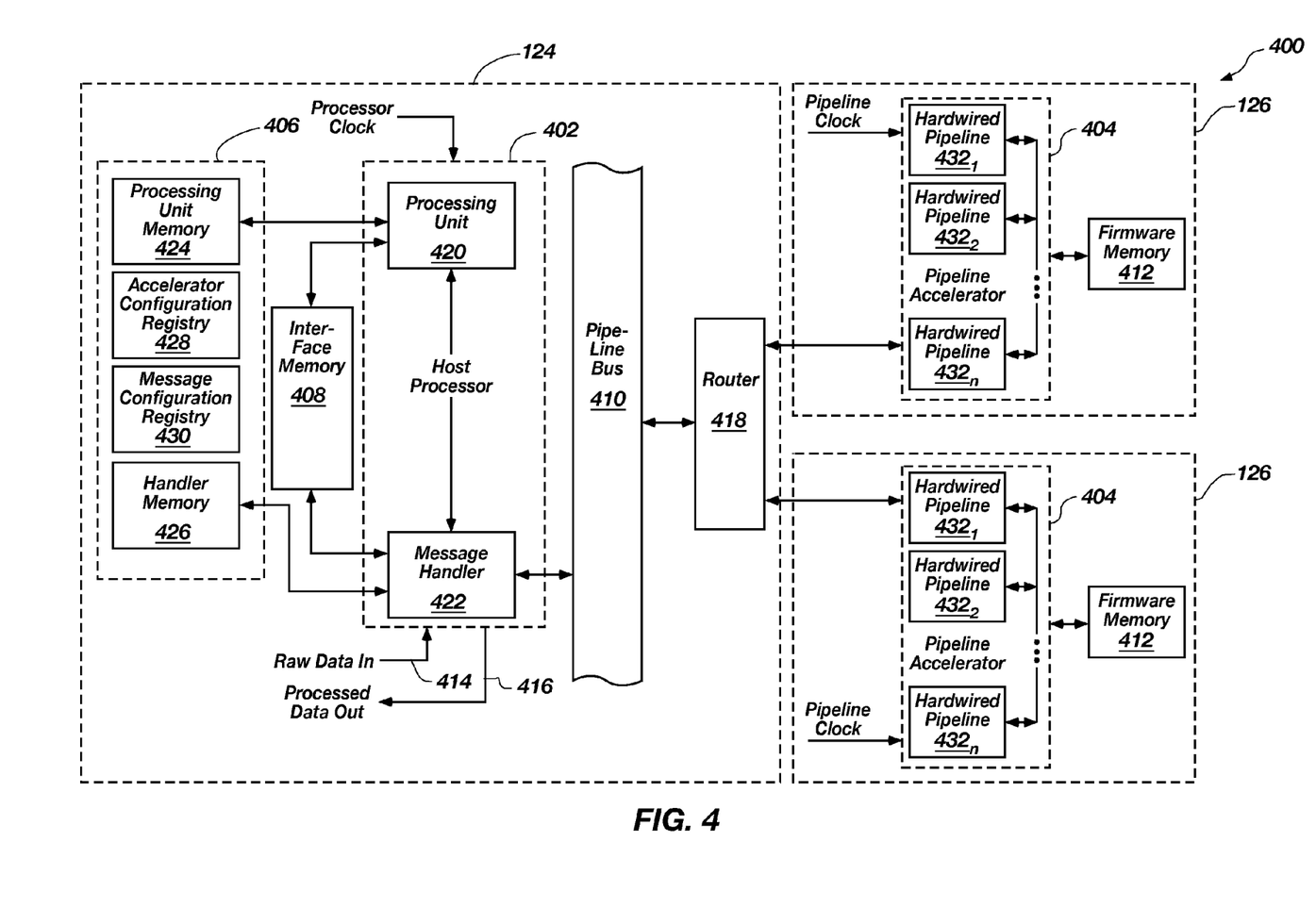
FIG. 4 is a schematic block diagram of an embodiment of the invention in which the electronic board assembly shown in FIGS. 2A and 2B is configured as a peer-vector computing machine.

Referring to the schematic block diagram of FIG. 4, in another embodiment of the invention, at least one, a portion, or each of the electronic board assemblies 118 may be configured as a peer-vector computing machine 400. As an example, the peer-vector computing machine 400 may be sufficiently powerful to provide processing power for a control system (not shown in FIG. 4) of a system, such as a missile or other unmanned vehicle, yet sufficiently small and energy efficient so that multiple peer-vector computing machines 400 may be installed in, for example, the tubular enclosure 102 and run off of the vehicle's power-supply system (not shown in FIG. 4), which may be a battery.

Still referring to FIG. 4, the carrier board 124 includes a host processor 402 and each electronic circuit board 126 includes a respective pipeline accelerator 404 that is operable to process at least a portion of the data processed by the peer-vector computing machine 400. Therefore, the host-processor 402 and the accelerators 404 are "peers" that may transfer data messages back and forth. Because each accelerator 404 includes hardwired logic circuits instantiated on one or more programmable-logic integrated circuits ("PLICs"), it executes few, if any, program instructions in the traditional sense (e.g., fetch an instruction, load the fetched instruction into an instruction register), and thus typically performs mathematically intensive operations on data significantly faster than a bank of instruction-executing computer processors can for a given clock frequency. Consequently, by combining the decision-making ability of the processor 402 and the number-crunching ability of the accelerators 404, the peer-vector computing machine 400 has the same abilities as, but can often process data faster than, a conventional processor-based computing machine. Furthermore, as discussed in U.S. Patent Publication No. 2004/0136241, which is incorporated by reference, providing each accelerator 404 with a communication interface that is compatible with the interface of the host processor 402 facilitates the design and modification of the peer-vector computing machine 400, particularly where the communication interface is an industry standard. In addition, for a given data-processing power, the peer-vector computing machine 400 is often smaller and more energy efficient than a processor-based computing machine. Moreover, the peer-vector computing machine 400 may also provide other advantages as described in the following other patent publications and applications, which are incorporated by reference: Publication Nos. 2004/0130927, 2004/

0133763, 2004/0170070, 2004/0181621, 2006/0085781, 2006/0087450, 2006/0101250, 2006/0101253, 2006/0101307, 2006/0123282, 2006/0149920, and 2006/0230377.

Still referring to FIG. 4, in addition to the host processor 402, the carrier board 124 of the peer-vector computing machine 400 also includes a processor memory 406, an interface memory 408, a pipeline bus 410, a firmware memory 412, an optional raw-data input port 414, an optional processed-data output port 416, and an optional router 418. The host processor 402 further includes a processing unit 420 and a message handler 422, and the processor memory 406 includes a processing-unit memory 424 and a handler memory 426, which respectively serve as both program and working memories for the processor unit and the message handler. The processor memory 424 also includes an accelerator-configuration registry 428 and a message-configuration registry 430, which store respective configuration data that allow the host processor 402 to configure the functioning of each accelerator 404 and the structure of the messages that the message handler 426 sends and receives.

The pipeline accelerator 404 of each electronic circuit board 126 includes at least one PLIC, such as a field-programmable gate array ("FPGA"), on which are disposed hardwired pipelines $432_1$ - $432_n$, which process respective data while executing few, if any, program instructions in the traditional sense. The firmware memory 412 of each electronic circuit board 126 stores the configuration firmware for the PLIC(s) of the accelerator 404. The accelerator 404 is discussed further in previously incorporated U.S. Patent Publication Nos. 2004/0130927, 2004/0136241, and 2004/0181621.

Generally, in one mode of operation of the peer-vector computing machine 400, respective pipelined accelerators 404 of the electronic circuit boards 126 receive data from one or more software applications running on the host processor 402, process this data in a pipelined fashion with one or more logic circuits that execute one or more mathematical algorithms, and then return the resulting data to the application(s). As stated above, because the logic circuits execute few if any software instructions in the traditional sense, they often process data one or more orders of magnitude faster than the host processor 402. Furthermore, because the logic circuits are instantiated on one or more PLICs, one can modify these circuits merely by modifying the firmware stored in the memory 412. That is, one need not modify the hardware components of the accelerators 404 or the interconnections between these components. The operation of the peer-vector machine 400 is further discussed in previously incorporated U.S. Patent Publication No. 2004/0133763, the functional topology and operation of the host processor 402 is further discussed in previously incorporated U.S. Patent Publication No. 2004/0181621, and the topology and operation of the accelerator 404 is further discussed in previously incorporated U.S. Patent Publication No. 2004/0136241.

Referring again to FIGS. 2B, 3, and 4, the electronic board assemblies 118 may be electrically interconnected in various manners to perform different computing functions. In an embodiment, the electronic board assemblies 118 may be coupled in series (i.e., "daisy chained" together) via cable connections between respective PCI-E switches 302 (FIG. 3) or host processors 402 (FIG. 4) to enable one or more of the electronic circuit boards 126 to communicate with electronic circuit boards 126 of another electronic board assembly 118. In such an embodiment, communication between two of the electronic circuit boards 126 of different electronic board assemblies 118 may be routed through the PCI-E switches 302 or host processor(s) 402 of the intervening electronic board assemblies 118. In an embodiment, a common cable bus may be provided and the PCI-E switches 302 or host processors 402 of each electronic board assembly 118 may be electrically connected to the common cable bus in parallel.

Figure 5A:
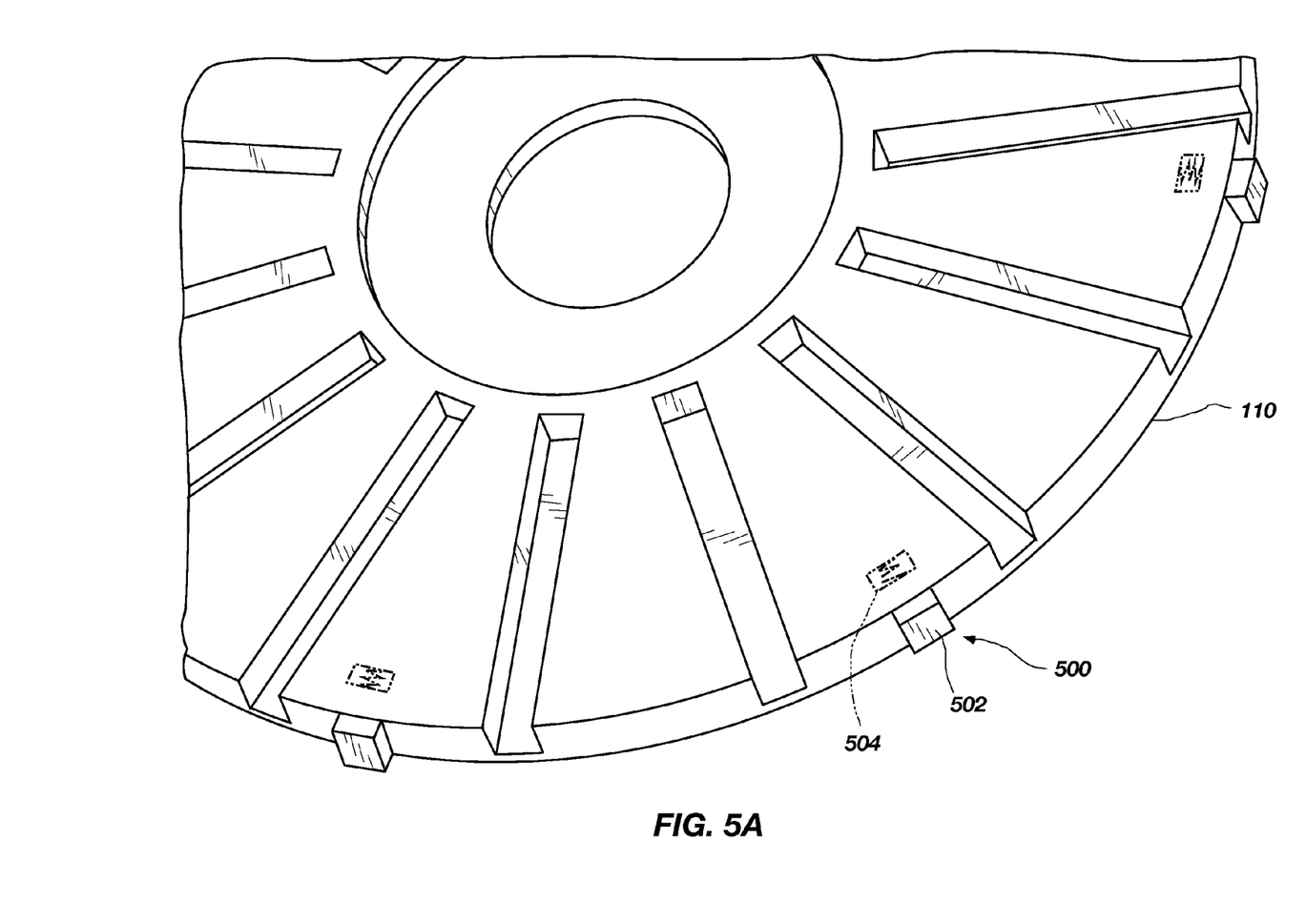
FIG. 5A is a partial isometric view of one of the circular plates shown in FIG. 1 having a plurality of retention mechanisms according to another embodiment of the invention.
Figure 5B:
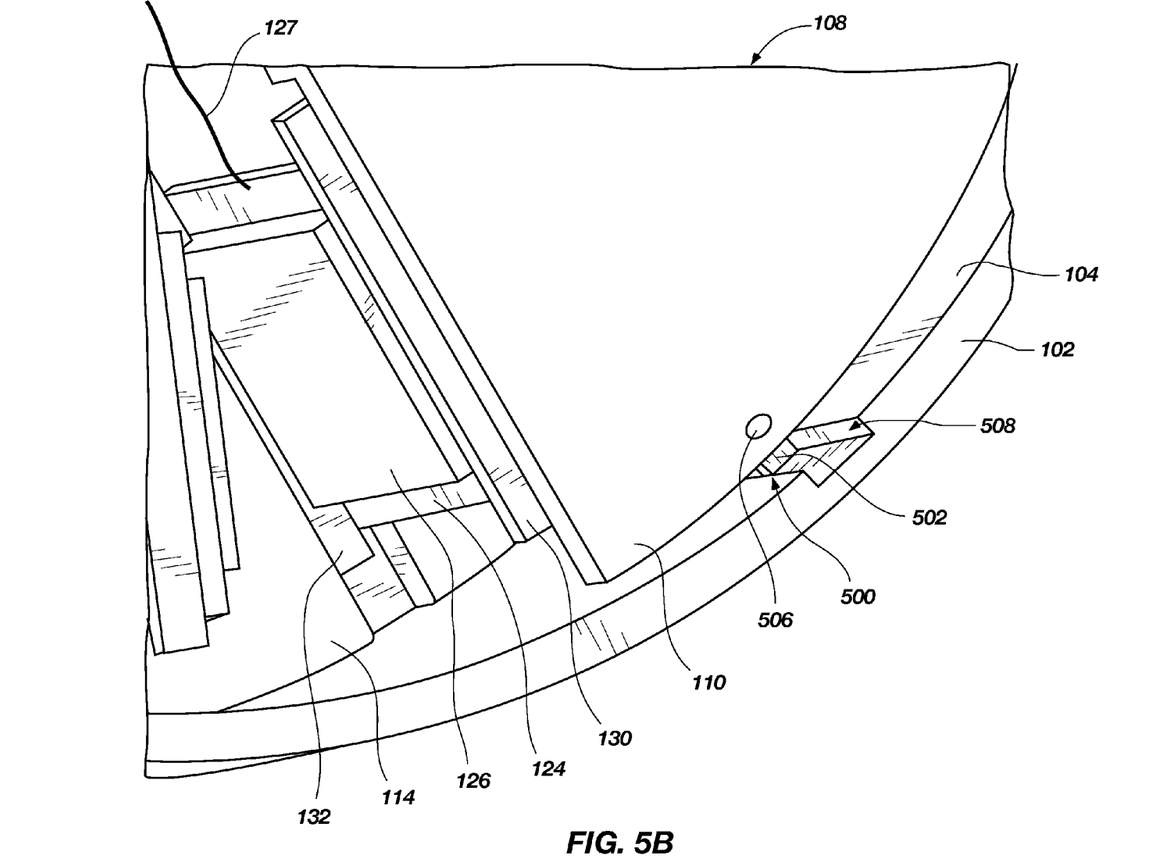
FIG. 5B is a partial isometric view of the electronics module shown in FIG. 2A including the retention mechanisms shown in FIG. 5A interfacing with a complementary slot or recess formed in the interior surface of the tubular enclosure according to an embodiment of the invention.

Referring to FIGS. 5A and 5B, various embodiments are provided herein for securing the electronics module 108 within the tubular housing 102. FIG. 5A is a partial isometric view of the first circular plate 110 having a plurality of retention mechanisms 500 according to one embodiment of the invention. However, it should be understood that the second circular plate 114 may also be similarly configured. Each retention mechanism 500 includes a locking feature 502 (e.g., a projection) mechanically coupled to a biasing element 504 (e.g., a compression spring or a piece of resilient, compressible material). The biasing element 504 may reside in an interior chamber formed in the first circular plate 110 and provide a radially outward biasing force against the locking feature 502.

Referring to FIG. 5B, the retention mechanism 500 may further include a manually operable actuation mechanism 506 operatively connected to the biasing element 504 (FIG. 5A) that is configured to retract the locking feature 502 radially inward within the first circular plate 110. Each locking feature 502 may be configured to reside within a correspondingly configured slot or recess 508 (i.e., a complementary interlocking structure) formed in the interior surface 104 of the tubular enclosure 102.

During use, an installer may retract each locking feature 502 of the retention mechanism 500 by actuating the corresponding actuation mechanism 506, and relatively position the electronics module 108 with respect to the tubular enclosure 102 so that the locking features 502 are in substantially registry with the slots or recesses 508 formed in the tubular enclosure 102. Then, the installer releases the actuation mechanisms 506 so that the respective locking features 502 are biased radially outwardly and into a corresponding one of the slots or recesses 508 to at least partially secure the electronics module 108 within the tubular enclosure 102. For example, when the slots or recesses 508 are oversized relative to the locking features 502 in an axial direction of the tubular enclosure 102, the electronics module 108 may still be able to be displaced axially within the tubular enclosure 102. When the slots or recesses 508 are dimensioned slightly larger than the locking features 502, axial displacement of the electronics module 108 within the tubular enclosure 102 is limited and may be almost insubstantial.

In another embodiment, the first and second circular plates 110 and 114 may each have keys (e.g., integrally formed projections or separate components attached thereto) that are not configured to be displaced radially inwardly or outwardly. In such an embodiment, the keys may be aligned with longitudinally extending slots (i.e., keyways) formed in the interior surface 104 of the tubular enclosure 102 and slid axially therewithin to a selected location. In an embodiment, the first and second circular plates 110 and 114 may each have radially extending keyways formed therein, and the interior surface 104 of the tubular enclosure 102 may have projections or keys extending therefrom in an arrangement corresponding to the arrangement of the keyways.

Figure 6:
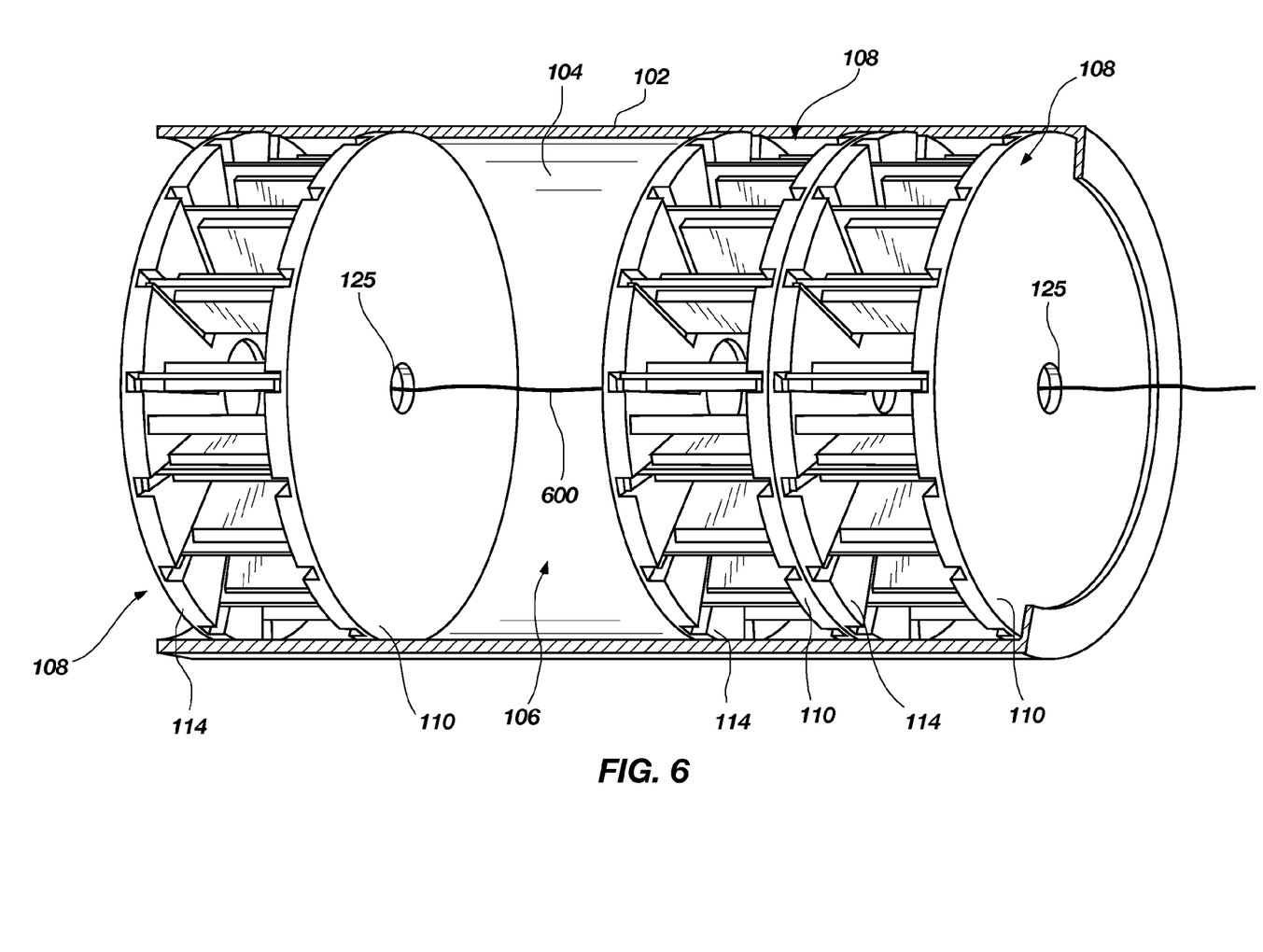
FIG. 6 is an isometric cut-away view of an electronic assembly including a plurality of electronics modules electrically interconnected with each other according to an embodiment of the invention.

Referring to FIG. 6, in an embodiment, a plurality of electronics modules 108 may be installed within the interior space 106 of the tubular enclosure 102 to increase computing power. For example, three of the electronics modules 108 are disposed in the tubular enclosure 102 shown in FIG. 6. In such an embodiment, each electronics module 108 may be electrically interconnected via a cable 600 that extends through the openings 125 formed in the first and second circular plates 110 and 114 of each electronics module 108. Accordingly, computing power may be increased by installing more of the electronics modules 108, as desired or needed for a particular application.

Figure 7:
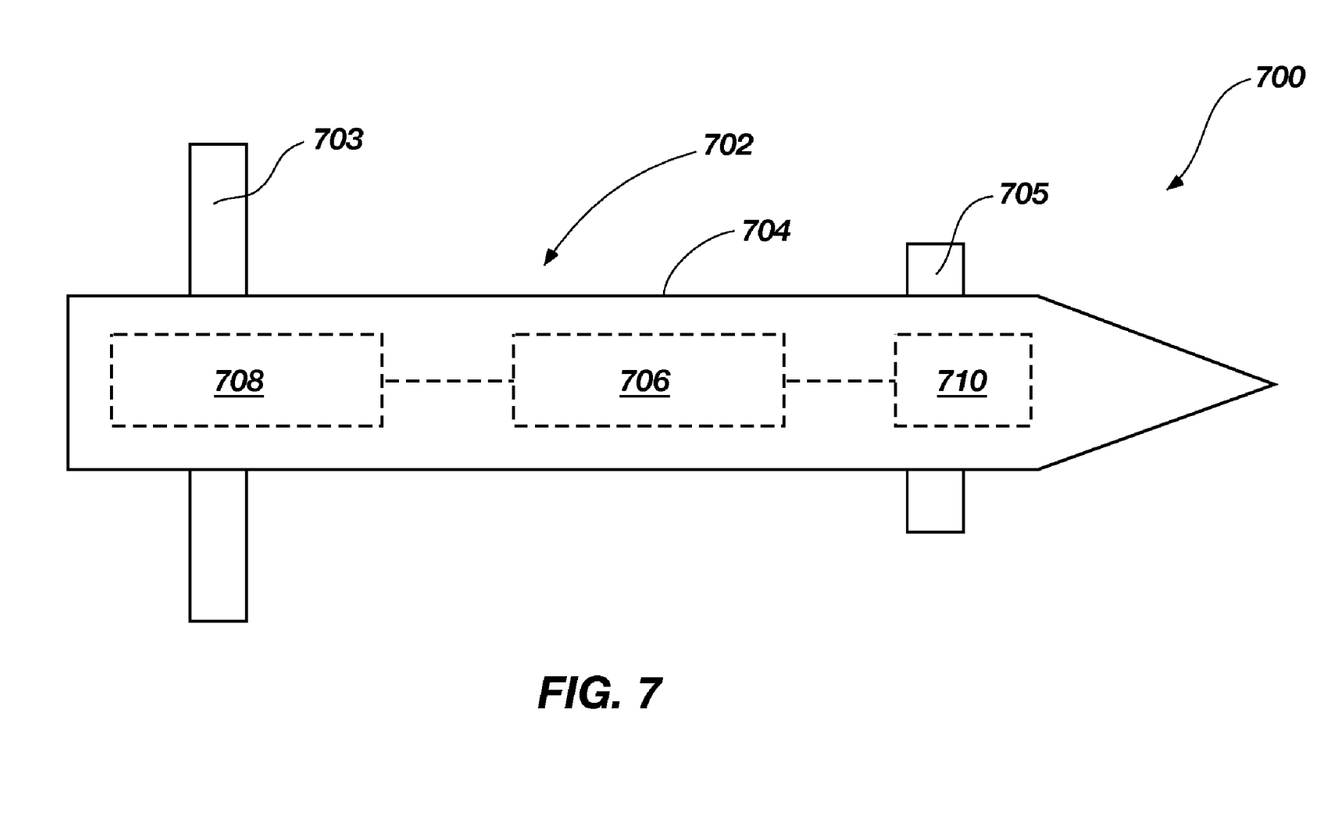
FIG. 7 is schematic diagram of a system, such as an UUV, including any of the disclosed enclosure assembly embodiments according to an embodiment of the invention.

Referring to FIG. 7, the described enclosure assemblies having at least one electronics module may be employed in a variety of different applications. FIG. 7 is schematic diagram of a system 700 according to an embodiment. For example, the system 700 may employed as an UUV. The system 700 includes an enclosure assembly 702 having a tubular enclosure 704 (i.e., a vehicle body) in which at least one electronics module 706 is installed according to the teachings of any of the disclosed embodiments. The electronics module 706 may employed for controlling the operation of any of the UUVs disclosed in U.S. Patent Publication No. 2006/0265927 and U.S. patent application Ser. No. 12/008,487, each of which is incorporated by this reference.

Still referring to FIG. 7, the tubular enclosure 704 may include rear control fins 703 projecting outwardly therefrom and front control fins 705. For example, the tubular enclosure 704 and electronics module 706 may be configured as any of the previously described embodiments. The electronics module 706 may be operatively coupled to a propulsion unit 708 (e.g., a motor), an optional warhead 710, and an actuation system (not shown) operable to controllably move the rear and front fins 703 and 705 to help direct the system 700, all of which reside in the tubular enclosure 704. The electronics module 706 is configured to control the operation of the propulsion unit 708, the actuation system, and, if applicable, detonation of the warhead 710. Although not shown in FIG. 7, in addition to the electronics module 706 being configured to control the propulsion unit 708, the electronics module 706 may also be configured to control a variety of different units housed by tubular enclosure 704, such as sensors, cameras, etc.

In other embodiments, the described enclosure assemblies having at least one electronics module may be employed in a missile, such as a torpedo, a ground-to-air missile, an air-to-ground missile, a ground-to-ground missile, or any other suitable application. Further applications include space craft or any other vehicle having an enclosure that can fit an electronics module as described herein.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the invention. Thus, the invention is not intended to be limited to the embodiments shown, but is to be accorded the widest scope consistent with the principles and features disclosed herein.

The invention claimed is:

1. An electronics module, comprising:
a first plate extending generally in a first plane and having a center with a first opening;
a second plate spaced from the first plate, extending generally in a second plane, and having a center with a second opening that is aligned with the first opening; and
a plurality of electronic board assemblies each of which extends generally in a respective plane, is supported by the first and second plates, and is in thermal communication with at least one of the first and second plates, each electronic board assembly positioned between the first and second plates and oriented so that the respective plane thereof is non-parallel relative to the first and second planes and is non-parallel relative to a respective plane in which at least one of the other electronic board assemblies lies.

2. The electronics module of claim 1 wherein the respective plane of each electronic board assembly is generally perpendicular to the first and second planes in which the first and second plates extend.

3. An electronics module, comprising:
a first plate extending generally in a first plane and having a center with a first opening;
a second plate spaced from the first plate, extending generally in a second plane, and having a center with a second opening that is aligned with the first opening;
a plurality of electronic board assemblies each of which extends generally in a respective plane and is in thermal communication with at least one of the first and second plates, each electronic board assembly positioned between the first and second plates and oriented so that the respective plane thereof is non-parallel relative to the first and second planes;
wherein the first plate comprises a first interior surface including a plurality of radially extending first slots formed therein;
wherein the second plate comprises a second interior surface that faces the first interior surface and includes a plurality of radially extending second slots formed therein; and
wherein each electronic board assembly is inserted into a corresponding one of the first slots and a corresponding one of the second slots.

4. An electronics module, comprising:
a first plate extending generally in a first plane;
a second plate spaced from the first plate and extending generally in a second plane;
a plurality of electronic board assemblies each of which extends generally in a respective plane and is in thermal communication with at least one of the first and second plates, each electronic board assembly positioned between the first and second plates and oriented so that the respective plane thereof is non-parallel relative to the first and second planes; and
wherein each electronic board assembly comprises a first mounting device that engages the first plate and a second mounting device that engages the second plate.

5. An electronics module, comprising:
a first plate extending generally in a first plane;
a second plate spaced from the first plate and extending generally in a second plane;
a plurality of electronic board assemblies each of which extends generally in a respective plane and is in thermal communication with at least one of the first and second plates, each electronic board assembly positioned between the first and second plates and oriented so that the respective plane thereof is non-parallel relative to the first and second planes;
wherein each electronic board assembly comprises a first mounting device that engages the first plate and a second mounting device that engages the second plate;
wherein the first mounting device of each electronic board assembly comprises a first locking device locked with the first plate and received by a corresponding radially extending first slot formed in the first plate; and
wherein the second mounting device of each electronic board assembly comprises a second locking device locked with the second plate and received by a corresponding radially extending second slot formed in the second plate.

6. An electronics module, comprising:
a first plate extending generally in a first plane;

a second plate spaced from the first plate and extending generally in a second plane;
a plurality of electronic board assemblies each of which extends generally in a respective plane and is in thermal communication with at least one of the first and second plates, each electronic board assembly positioned between the first and second plates and oriented so that the respective plane thereof is non-parallel relative to the first and second planes; and
wherein at least one of the first and second plates comprises at least one locking feature that is adjustable to protrude from an outer edge of the at least one plate.

7. An electronics module, comprising:
a first plate extending generally in a first plane;
a second plate spaced from the first plate and extending generally in a second plane; and
a plurality of electronic board assemblies each of which extends generally in a respective plane and is in thermal communication with at least one of the first and second plates, each electronic board assembly positioned between the first and second plates and oriented so that the respective plane thereof is non-parallel relative to the first and second planes; and
wherein at least one of the first and second plates comprises at least one retention mechanism including a locking feature and a biasing element operable to bias the locking feature radially outward.

8. An electronics module, comprising:
a first plate extending generally in a first plane;
a second plate spaced from the first plate and extending generally in a second plane;
a plurality of electronic board assemblies each of which extends generally in a respective plane and is in thermal communication with at least one of the first and second plates, each electronic board assembly positioned between the first and second plates and oriented so that the respective plane thereof is non-parallel relative to the first and second planes;
a first thermally conductive gasket extending about the first plate; and
a second thermally conductive gasket extending about the second plate.

9. The electronics module of claim 1 wherein:
the first and second plates each have a diameter of at least about 8 inches; and
each electronic board assembly has a length of about 4 inches.

10. The electronics module of claim 9 wherein the diameter is about 21 inches.

11. An electronics module, comprising:
a first plate extending generally in a first plane;
a second plate spaced from the first plate and extending generally in a second plane;
a plurality of electronic board assemblies each of which extends generally in a respective plane and is in thermal communication with at least one of the first and second plates, each electronic board assembly positioned between the first and second plates and oriented so that the respective plane thereof is non-parallel relative to the first and second planes; and
wherein each electronic board assembly comprises external electrical connectors that are not located within an edge region thereof.

12. The electronics module of claim 1 wherein:
the first plate is configured as a first generally circular plate; and
the second plate is configured as a second generally circular plate.

13. The electronics module of claim 1 wherein at least one of the electronic board assemblies comprises:
a carrier board including a first side and an opposing second side;
a first electronic circuit board mounted to the first side and operatively coupled to the carrier substrate; and
a second electronic circuit board mounted to the second side and operatively coupled to the carrier substrate.

14. The electronics module of claim 13 wherein:
the first electronic circuit board comprises a first PCI mezzanine board; and
the second electronic circuit board comprises a second PCI mezzanine board.

15. The electronics module of claim 1 wherein at least one of the electronic board assemblies comprises:
a carrier board including a first side and an opposing second side;
a first electronic circuit board mounted to the first side of the carrier board and operatively coupled to the carrier board, the first electronic circuit board including a first pipeline accelerator; and
a second electronic circuit board mounted to the second side of the carrier board and operatively coupled to the carrier board, the second electronic circuit board including a second pipeline accelerator.

16. An enclosure assembly, comprising:
an enclosure including an interior surface defining an interior space;
at least one electronics module positioned within the interior space, the at least one electronics module including:
a first plate extending generally in a first plane and including a first outer peripheral surface configured to be in thermal contact with the interior surface of the enclosure;
a second plate extending generally in a second plane and including a second outer peripheral surface configured to be in thermal contact with the interior surface of the enclosure; and
a plurality of electronic board assemblies each of which extends generally in a respective plane and is in thermal communication with at least one of the first and second plates, each electronic board assembly positioned between and oriented so that the respective plane thereof is non-parallel relative to the first and second planes.

17. The enclosure assembly of claim 16 wherein:
the interior surface of the enclosure comprises at least one interlocking feature; and
at least one of the first and second plates comprises at least one circumferentially-disposed interlocking feature interlocking with the at least one interlocking feature of the enclosure.

18. The enclosure assembly of claim 16 wherein:
at least one of the first and second plates of the at least one electronics module comprises at least one retention mechanism including a locking feature and a biasing element operable to bias the locking feature radially outward toward the interior surface of the enclosure.

19. The enclosure assembly of claim 16 wherein the at least one electronics module comprises:
a first thermally conductive gasket extending about the first outer peripheral surface and abutting the interior surface of the enclosure; and a second thermally conductive gasket extending about the second outer peripheral surface and abutting the interior surface of the enclosure.

20. The enclosure assembly of claim 19 wherein the first and second thermally conductive gaskets each comprises graphite foil.

21. The electronics module of claim 16 wherein the respective plane of each electronic board assembly is generally perpendicular to the first and second planes in which the first and second plates extend.

22. The enclosure assembly of claim 16 wherein:
the first and second plates of the at least one electronics module each has a diameter of at least about 8 inches; and
each electronic board assembly of the at least one electronics module has a length of about 4 inches.

23. The enclosure assembly of claim 22 wherein the diameter is about 21 inches.

24. The enclosure assembly of claim 16 wherein at least one of the first and second plates of the at least one electronics module comprises a through hole through which a cable coupled to the electronic board assemblies extend.

25. The enclosure assembly of claim 16 wherein the at least one electronics module comprises a plurality of electronics modules each of which is positioned within the interior space and electrically coupled to a common bus.

26. The enclosure assembly of claim 16 wherein each electronic board assembly comprises external electrical connectors that are not located within an edge region thereof.

27. The enclosure assembly of claim 16 wherein at least one of the electronic board assemblies of the at least one electronics modules comprises:
a carrier board including a first side and an opposing second side;
a first electronic circuit board mounted to the first side and operatively coupled to the carrier substrate; and
a second electronic circuit board mounted to the second side and operatively coupled to the carrier substrate.

28. The enclosure assembly of claim 27 wherein:
the first electronic circuit board comprises a first PCI mezzanine board; and
the second electronic circuit board comprises a second PCI mezzanine board.

29. The enclosure assembly of claim 16 wherein at least one of the electronic board assemblies of the at least one electronics modules comprises:
a carrier board including a first side and an opposing second side;
a first electronic circuit board mounted to the first side of the carrier board and operatively coupled to the carrier board, the first electronic circuit board including a first pipeline accelerator; and
a second electronic circuit board mounted to the second side of the carrier board and operatively coupled to the carrier board, the second electronic circuit board including a second pipeline accelerator.

30. The enclosure assembly of claim 16 wherein:
the first plate of the at least one electronics module comprises a first interior surface including a plurality of radially extending first slots formed therein;
the second plate of the at least one electronics module comprises a second interior surface that faces the first interior surface and includes a plurality of radially extending second slots formed therein; and
each electronic board assembly of the at least one electronics module is inserted into a corresponding one of the first slots and a corresponding one of the second slots.

31. The enclosure assembly of claim 16 wherein each electronic board assembly of the at least one electronics module comprises a first mounting device that engages the first plate and a second mounting device of the pair that engages the second plate.

32. The enclosure assembly of claim 16 wherein the enclosure is configured as a substantially tubular enclosure.

33. The enclosure assembly of claim 16 wherein:
the first plate is configured as a first generally circular plate; and
the second plate is configured as a second generally circular plate.

34. A system, comprising:
an enclosure including an interior surface defining an interior space;
at least one electronics module positioned within the interior space and including:
a first plate extending generally in a first plane;
a second plate spaced from the first plate and extending generally in a second plane; and
a plurality of electronic board assemblies each of which extends generally in a respective plane and is in thermal communication with at least one of the first and second plates, each electronic board assembly positioned between and oriented so that the respective plane thereof is non-parallel relative to the first and second planes; and
a propulsion system operatively coupled to the at least one electronics module.

35. The system of claim 34 wherein the enclosure forms at least part of a missile body.

36. The system of claim 34 wherein the enclosure forms at least part of a vehicle body.

37. A method, comprising:
inserting at least one electronics module into an interior space of an enclosure;
relatively aligning at least one interlocking feature of the at least one electronics module with at least one interlocking feature of the interior surface of the enclosure; and
engaging the at least one interlocking feature of the at least one electronics module with the at least one interlocking feature of the interior surface of the enclosure.

* * * * *